(12) United States Patent
Sakano (10) Patent No.: US 7,884,528 B2
(45) Date of Patent: Feb. 8, 2011

(54) DRIVING APPARATUS (75) Inventor: Hiromichi Sakano, Tokyo (JP)

(73) Assignee: Olympus Imaging Corp. (JP)

(*) Notice: Subject to any disclaimer, the term of this patent is extended or adjusted under 35 U.S.C. 154(b) by 164 days.

(21) Appl. No.: 12/144,751

(22) Filed: Jun. 24, 2008

(65) Prior Publication Data
US 2009/0001854 A1      Jan. 1, 2009

(30) Foreign Application Priority Data
Jun. 29, 2007   (JP) .............................. 2007-173244

(51) Int. Cl.
H01L 41/08 (2006.01)
(52) U.S. Cl. .................... 310/323.02; 310/326
(58) Field of Classification Search ............ 310/323.02, 310/326
See application file for complete search history.

(56) References Cited
U.S. PATENT DOCUMENTS

| | | | | |
|---|---|---|---|---|
| 4,959,580 A | * | 9/1990 | Vishnevsky et al. | .... 310/323.02 |
| 5,191,688 A | * | 3/1993 | Takizawa et al. | ........... 29/25.35 |
| 6,051,912 A | * | 4/2000 | Gonda | .................... 310/323.02 |
| 7,161,277 B2 | * | 1/2007 | Yuasa et al. | ............ 310/323.02 |
| 7,405,508 B2 | * | 7/2008 | Petrenko | ..................... 310/317 |

FOREIGN PATENT DOCUMENTS

| | | |
|---|---|---|
| EP | 0603527 A1 | 6/1994 |
| JP | 07-104166 | 4/1995 |
| JP | 2005-331549 | 12/2005 |

OTHER PUBLICATIONS

Office Action issued by the Chinese Patent Office on Oct. 12, 2010 in connection with corresponding Chinese Patent Application No. 200810131902.3.

* cited by examiner

*Primary Examiner*—Mark Budd
(74) *Attorney, Agent, or Firm*—Ostrolenk Faber LLP (57) ABSTRACT A driving apparatus has a piezoelectric element as a driver. The driving apparatus includes a first vibrator which generates an elliptical vibration when a voltage of a predetermined frequency is applied; a first member which holds the first vibrator; a second member which includes a first sliding member to which the first vibrator is pressed and makes a relative displacement with respect to the first member by being driven by the elliptical vibration of the first vibrator; and a first resonance preventive member which is provided to the second member and prevents a resonance in the second member from being generated by the elliptical vibration of the first vibrator.

17 Claims, 11 Drawing Sheets

DRIVING APPARATUS

CROSS-REFERENCE TO RELATED APPLICATIONS

This application is based upon and claims the benefit of priority from Japanese Patent Application No. 2007-173244, filed on Jun. 29, 2007, the entire contents of which are incorporated herein by reference.

BACKGROUND OF THE INVENTION

1. Field of the Invention

The present invention relates to a driving apparatus which uses an elliptical vibration of a vibrator to drive and move a mobile body in a predetermined direction.

2. Description of the Related Art

Conventionally, a camera, for example, is known as an image pickup apparatus having a function of correcting a blurring motion. As the blurring-motion correcting function of the camera, an image stabilizing function in which a blur of an image on an imaging area of an image pickup element is corrected is known. In the image stabilizing function, a blurring vibration in a pitch direction of the camera and a blurring vibration in a yaw direction of the camera are detected by using a blurring motion detector such as an angular velocity sensor. Then, based on the detected blur signal, an image pickup element or a part of an image pickup optical system is shifted to negate the blurring motion, independently in the lateral direction and the vertical direction in a plane perpendicular to an imaging optical axis.

In an image stabilizing mechanism which realizes the image stabilizing function, a driving unit which moves, to correct a blurring motion caused by a hand movement, the image pickup element itself or a part of an imaging lens in the lateral direction and the vertical direction in the plane perpendicular to the imaging optical axis is used. To operate by following the blurring motion caused by a hand movement, the driving unit is required to have a high response performance, an accurate driving (a minute driving), and a self-retaining capability by which a position of a mobile body is retained even when a power source is turned off.

In response to such requirements, an image stabilizing mechanism using an impact actuator is disclosed in Japanese Patent Application Laid-Open No. 2005-331549, and an apparatus which uses a vibrational wave actuator to drive a lens is disclosed in Japanese Patent Application Laid-Open No. H7-104166.

SUMMARY OF THE INVENTION

A driving apparatus according to an aspect of the present invention has a piezoelectric element as a driver, and includes a first vibrator which generates an elliptical vibration when a voltage of a predetermined frequency is applied; a first member which holds the first vibrator; a second member which includes a first sliding member to which the first vibrator is pressed and makes a relative displacement with respect to the first member by being driven by the elliptical vibration of the first vibrator; and a first resonance preventive member which is provided to the second member and prevents a resonance in the second member from being generated by the elliptical vibration of the first vibrator.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of a driving apparatus and an image pickup apparatus according to the present invention will be explained below with reference to the accompanying drawings. The image pickup apparatus according to an embodiment is equipped with the driving apparatus used for correcting a blurring motion caused by a hand movement in an image pickup unit including an image pickup element which obtains image signals via a photoelectric conversion. In the embodiment, the image pickup apparatus will be explained as an application to a single-lens reflex electronic camera (digital camera) with interchangeable lenses, as one example. It should be noted that the present invention is not limited to the embodiments, and various modifications may be made without departing from the spirit or scope of the general inventive concept of the present invention.

Figure 1:
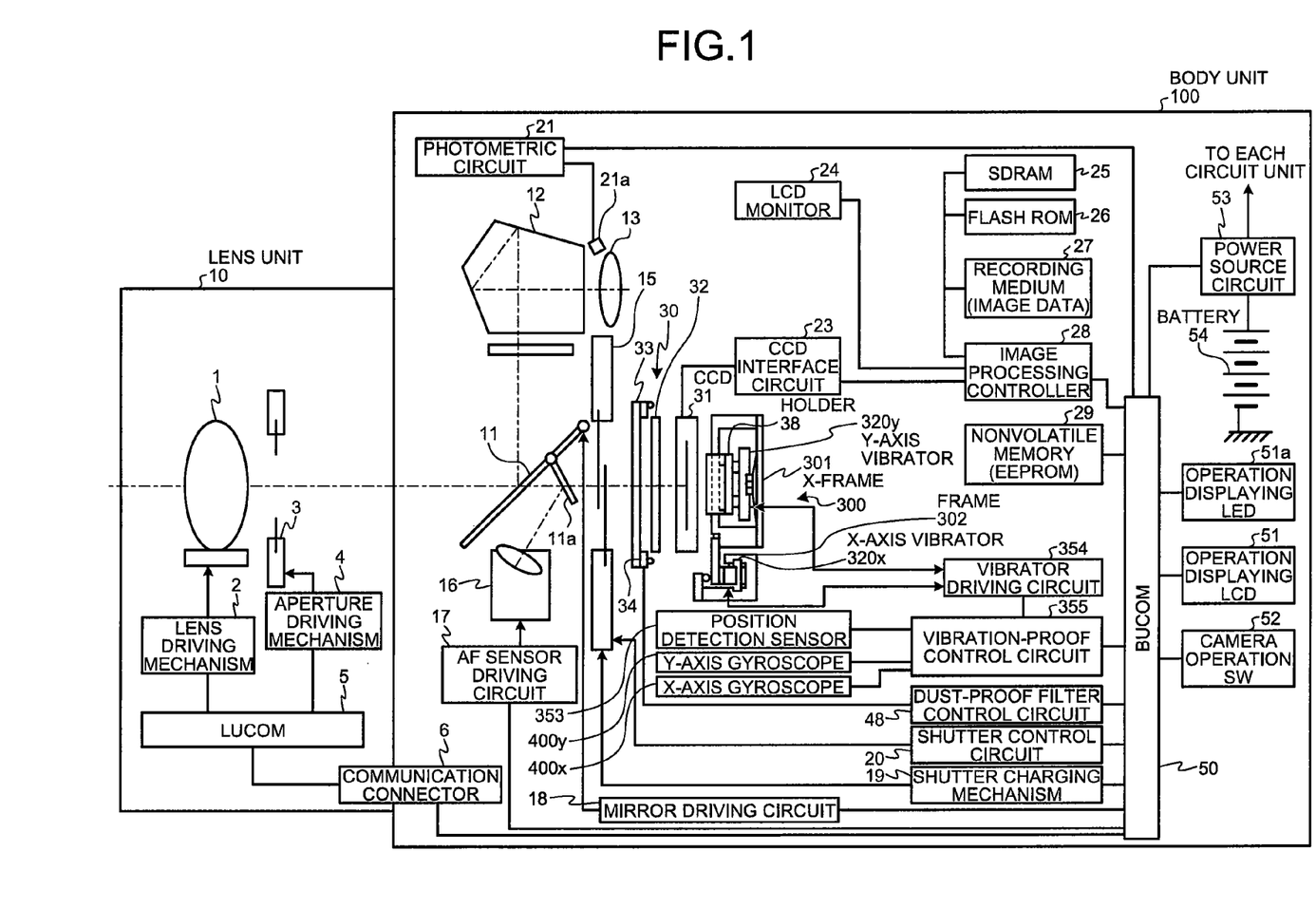
FIG. 1 is a schematic block diagram mainly showing an electric system structure of a camera according to an embodiment of the present invention.

First, an example of a system structure of the camera according to the embodiment will be explained with reference to FIG. 1. FIG. 1 is a schematic block diagram mainly showing an electric system structure of the camera according to the embodiment. The system of the camera according to the embodiment includes a body unit 100 as a main body of the camera and a lens unit 10 as an interchangeable lens which is one of accessories of the camera.

The lens unit 10 is detachably attached via a lens mount which is provided at a front surface of the body unit 100. The lens unit 10 is controlled by a lens-controlling microcomputer (hereinafter referred to as "Lucom") 5 included in itself. The body unit 100 is controlled by a body-controlling microcomputer (hereinafter referred to as "Bucom") 50. The Lucom 5 and the Bucom 50 are electrically connected via a communication connector 6 to allow a communication therebetween in a state where the lens unit 10 is attached to the body unit 100. As a camera system, the Lucom 5 is configured to operate subserviently in cooperation with the Bucom 50.

The lens unit 10 includes an imaging lens 1 and an aperture 3. The imaging lens 1 is driven by a DC motor which is provided in a lens driving mechanism 2. The aperture 3 is driven by a stepping motor which is provided in an aperture mechanism 4. The Lucom 5 controls each motor based on a command from the Bucom 50.

In the body unit 100, the following constructional members are arranged as shown in FIG. 1. For example, constructional members (a pentaprism 12, a quick-return mirror 11, an eyepiece 13, and a sub-mirror 11a) of a single-lens reflex system as an optical system; a shutter 15 of a focal plane system on an imaging optical axis; and an AF sensor unit 16 are provided. The AF sensor unit 16 serves to receive a light beam reflected from the sub-mirror 11a and detect an amount of defocusing.

In addition, the body unit 100 is provided therein with an AF sensor driving circuit 17, a mirror driving circuit 18, a shutter charging mechanism 19, a shutter control circuit 20, and a photometric circuit 21. The AF sensor driving circuit 17 controls a driving of the AF sensor unit 16. The mirror driving circuit 18 controls a driving of the quick-return mirror 11. The shutter charging mechanism 19 charges a spring which drives a first shutter curtain and a second shutter curtain of the shutter 15. The shutter control circuit 20 controls a motion of the first shutter curtain and the second shutter curtain. The photometric circuit 21 performs a photometric processing based on a photometric sensor 21a which detects a light beam from the pentaprism 12.

An image pickup unit 30 for performing a photoelectric conversion of a subject image which has passed through the optical system described above is provided on the imaging optical axis. The image pickup unit 30 is integrally formed as a unit including a CCD 31 as an image pickup element, an optical low-pass filter (LPF) 32 provided at an anterior surface of the CCD 31, and a dust-proof filter 33. A piezoelectric element 34 is attached at the periphery of the dust-proof filter 33. The piezoelectric element 34 having two electrodes is configured to vibrate at a predetermined frequency by being controlled by a dust-proof filter control circuit 48 and to make the dust-proof filter 33 vibrate, so that a dust adhering to the filter surface can be removed. The image pickup unit 30 is provided with a vibration-proof unit for correcting a blurring motion caused by a hand movement, which will be explained later.

The camera system according to the embodiment includes a CCD interface circuit 23 connected to the CCD 31, a liquid crystal display (LCD) monitor 24, an SDRAM 25 which functions as a storage area, and an image processing controller 28 which performs an image processing by using a Flash ROM 26 and the like. With this structure, the camera system according to the embodiment is configured to be able to provide an electronic image-pickup function and an electronic record-display function. Here, a recording medium 27, being an external recording medium such as a memory card of various types and an external hard disc drive, is interchangeably attached to the camera main body via a communication connector to allow a communication therebetween. Image data obtained by imaging is recorded in the recording medium 27. As another storage area, a nonvolatile memory 29 which, for example realized by an EEPROM, stores predetermined control parameters necessary for controlling the camera, is provided so as to be accessed by the Bucom 50.

The Bucom 50 is provided with an operation displaying LCD 51 and an operation displaying LED 51a which inform a user of an operation state of the camera via a display output, and a camera operation SW 52. The camera operation SW 52 is a group of switches including operation buttons such as a release SW, a mode change SW, and a power SW necessary for operating the camera. The Bucom 50 is further provided with a battery 54 as a power source, a power source circuit 53 which supplies a voltage of the battery 54 after converting to a voltage necessary for each circuit unit constituting the camera system, and a voltage detecting circuit which detects a voltage change at the time when a current is supplied from an external power source via a jack.

Figure 2:
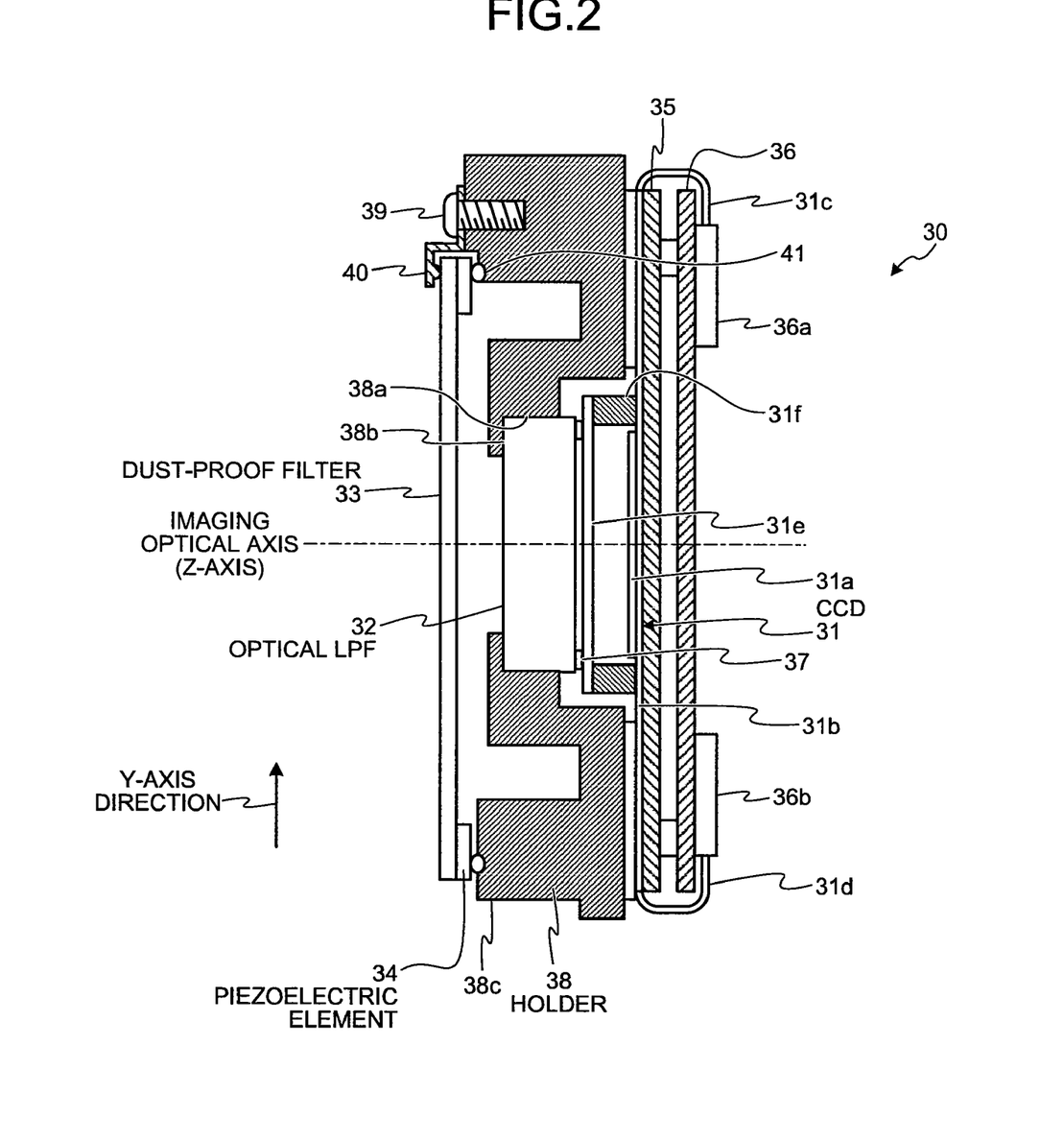
FIG. 2 is a side view of a longitudinal section showing a structural example of an image pickup unit.

Next, the image pickup unit 30 including the CCD 31 will be explained with reference to FIG. 2. FIG. 2 is a side view of a longitudinal section showing a structural example of the image pickup unit 30. The image pickup unit 30 includes the CCD 31 as an image pickup element, the optical low-pass filter (LPF) 32, the dust-proof filter 33, and the piezoelectric element 34. The CCD 31 serves to obtain an image signal corresponding to the light which has passed through the imaging optical system and been exposed to a photoelectric conversion surface of the CCD 31. The optical low-pass filter (LPF) 32 is provided at a side of the photoelectric conversion surface of the CCD 31 and serves to eliminate a high-frequency component from the light beam which has passed through the imaging optical system to be exposed to a subject body. The dust-proof filter 33 is arranged to face the optical LPF 32 with a predetermined interval at the anterior surface side of the optical LPF 32. The piezoelectric element 34 is arranged at the periphery of the dust-proof filter 33 and serves to feed a predetermined vibration to the dust-proof filter 33.

Here, a CCD chip 31a of the CCD 31 is directly mounted on a flexible substrate 31b arranged on a clamping plate 35. Connecting parts 31c and 31d extended from both ends of the flexible substrate 31b are connected to a side of a main circuit substrate 36 via connectors 36a and 36b provided on the main circuit substrate 36. A protection glass 31e of the CCD 31 is fixed on the flexible substrate 31b via a spacer 31f.

A filter receiving member 37 formed of an elastic member and the like is provided between the CCD 31 and the optical LPF 32. The filter receiving member 37 is arranged at a periphery position, which is away from the effective range of the photoelectric conversion surface, on the anterior surface side of the CCD 31 and is in direct contact with a proximity of the periphery on the posterior surface side of the optical LPF 32, so that a substantial airtightness is retained between the CCD 31 and the optical LPF 32. A holder 38 as a third member which covers the CCD 31 and the optical LPF 32 in the airtight manner is further provided. The holder 38 has an opening 38a of a rectangular shape substantially at a center part around the imaging optical axis. A step part 38b whose cross section has a substantial L-shape is formed in an inner periphery of the opening 38a at a side of the dust-proof filter 33, and the optical LPF 32 and the CCD 31 are arranged from the posterior side to the opening 38a. Here, the periphery part on the anterior surface side of the optical LPF 32 is arranged to be in contact with the step part 38b substantially in the airtight manner, so that the optical LPF 32 is restrictively positioned in the imaging optical axis direction by the step part 38*b* and is prevented from getting out of the inside of the holder 38 to the anterior surface side.

Meanwhile, a dust-proof-filter receiving part 38*c* which protrudes toward the anterior surface side more than the step part 38*b* is formed in the entire circumference at the periphery part on the anterior surface side of the holder 38, so as to retain the dust-proof filter 33 at the anterior side of the optical LPF 32 with a predetermined distance. The dust-proof filter 33 formed in a circular plate or a polygonal plate as a whole is supported by the dust-proof-filter receiving part 38*c* in a state of being pressed by a pressing member 40 which is formed of an elastic body such as a leaf spring and fixed to the dust-proof-filter receiving part 38*c* with a screw 39. Here, a seal 41 having a ring-like form is provided between the dust-proof-filter receiving part 38*c* and the part of the piezoelectric element 34 which is arranged at a marginal part on the rear surface side of the dust-proof filter 33, so that the airtight state is secured. In this manner, the image pickup unit 30 is configured to have an airtight structure including the holder 38 which is formed in a desired size suitable for mounting the CCD 31.

Next, a function of correcting the blurring motion caused by a hand movement of the camera according to the embodiment will be explained. In the embodiment, the position of the CCD 31 as the image pickup element is configured to be changed and moved, to compensate the blurring motion, in an X-axis direction as a first direction and a Y-axis direction as a second direction which are mutually orthogonal in the XY plane perpendicular to the imaging optical axis whose direction is set to be a Z-axis direction. The vibration-proof unit including a driving apparatus for correcting the blurring motion caused by a hand movement is configured to use, as a driving source, a vibrator which generates an elliptical vibration in a driving part when a voltage of a predetermined frequency is applied, and to have the holder 38 which mounts the CCD 31 in the image pickup unit 30 as a moving target.

Figure 3A:
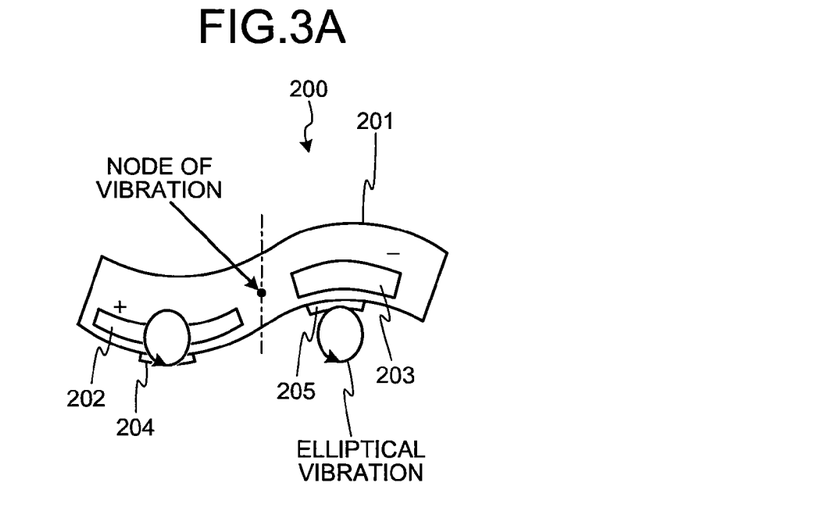
FIG. 3 is a view showing an operation principle of a vibrator.
Figure 3B:
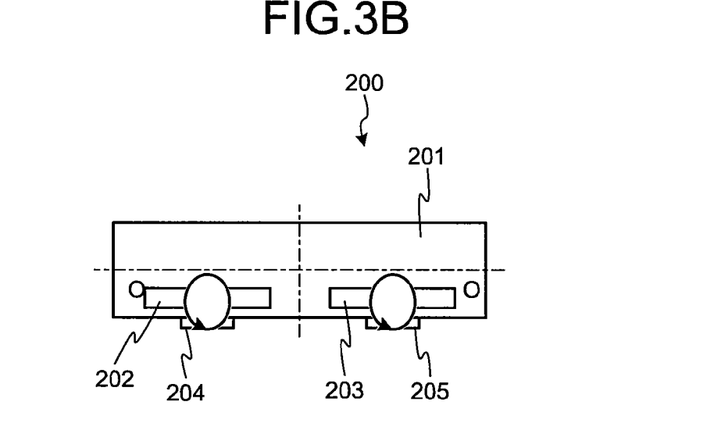
Figure 3C:
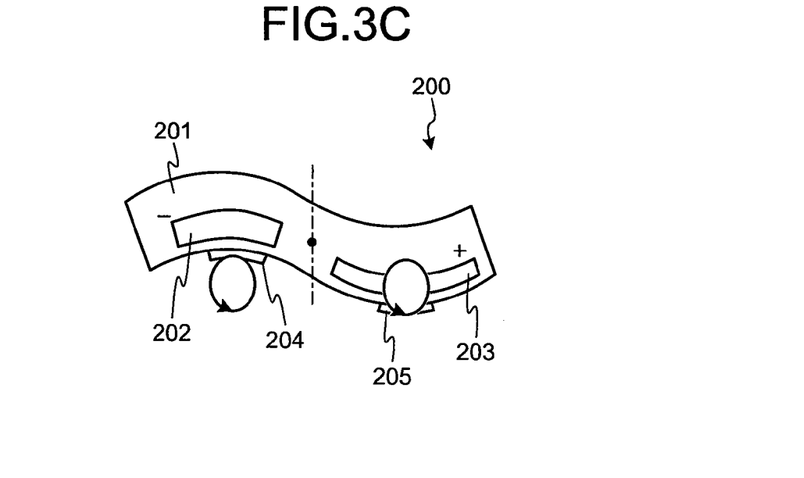

First, an operation principle of the vibrator used as the driving source in the driving apparatus according to the embodiment will be explained. FIG. 3 is a view showing the operation principle of the vibrator. A vibrator 200 includes a piezoelectric body 201, a pair of driving electrodes 202 and 203, and drivers 204 and 205 as the driving part. The piezoelectric body 201 is formed to have a rectangular shape in a predetermined size. The pair of driving electrodes 202 and 203 are formed to be located at one surface side of the piezoelectric body 201 and centrally symmetric. The drivers 204 and 205 are provided at positions, corresponding to the driving electrodes 202 and 203, on a surface of the piezoelectric body 201. When a positive voltage is applied to the driving electrode 202, the driving electrode 202 deforms to stretch while a part on the rear surface side of the piezoelectric body 201 does not deform to stretch, and thereby an arc-shape deformation is caused as a whole, as shown in FIG. 3(*a*). In contrast, when a negative voltage is applied to the driving electrode 202, the driving electrode 202 deforms to shrink while the part on the rear surface side of the piezoelectric body 201 does not deform to shrink, and thereby an arc-shape deformation whose warp is reverse to that shown in FIG. 3(*a*) is caused as a whole, as shown in FIG. 3(*c*). The same applies to the side of the driving electrode 203.

To generate the elliptical vibration on the surfaces of the drivers 204 and 205, a sine wave voltage of a predetermined frequency is applied to the driving electrode 202 in the piezoelectric body 201, and a sine wave voltage of a shifted phase and of the same frequency as that of the voltage applied to the driving electrode 202 is applied to the driving electrode 203. The frequency of the voltage to be applied is set to a predetermined numeric value which enables a center of the piezoelectric body 201 to be a node of the curvature vibration, the drivers 204 and 205 to be antinodes of the curvature vibration, and a node of a longitudinal vibration of the piezoelectric body 201 to be coincident with the node of the curvature vibration. As a result, according to changes between positive and negative in the applying voltage, the vibrator 200 repeats the curvature vibrations shown in FIG. 3(*a*) to (*c*) including a restored state shown in FIG. 3(*b*), so that the elliptical vibration is generated on the surfaces of the drivers 204 and 205. Therefore, when a mobile body as a driving target is arranged so as to be pressed and contacted onto the drivers 204 and 205 of the vibrator 200, the mobile body moves according to the direction of the elliptical vibration generated on the surfaces of the drivers 204 and 205.

On this occasion, when a phase difference in the voltage of the predetermined frequency applied to the driving electrodes 202 and 203 is changed, the shape of the elliptical vibration generated on the surfaces of the drivers 204 and 205 can be changed, and thereby the moving velocity of the mobile body which moves by being driven by the vibrator 200 can be changed. For example, when the phase difference in the voltage of the predetermined frequency is zero degree, the velocity is zero. An increase in the phase difference causes a gradual increase in the velocity, a phase difference of plus 90 degrees causes a maximum velocity. A greater phase difference than the plus 90 degrees reversely causes a gradual decrease in the velocity and a phase difference of plus 180 degrees again causes zero velocity. When the phase difference is set to a negative value, the rotating direction of the elliptical vibration generated on the drivers 204 and 205 becomes reverse, and thereby the mobile body can be driven in the reverse direction. In this case, a phase difference of minus 90 degrees also causes the maximum velocity.

Figure 4:
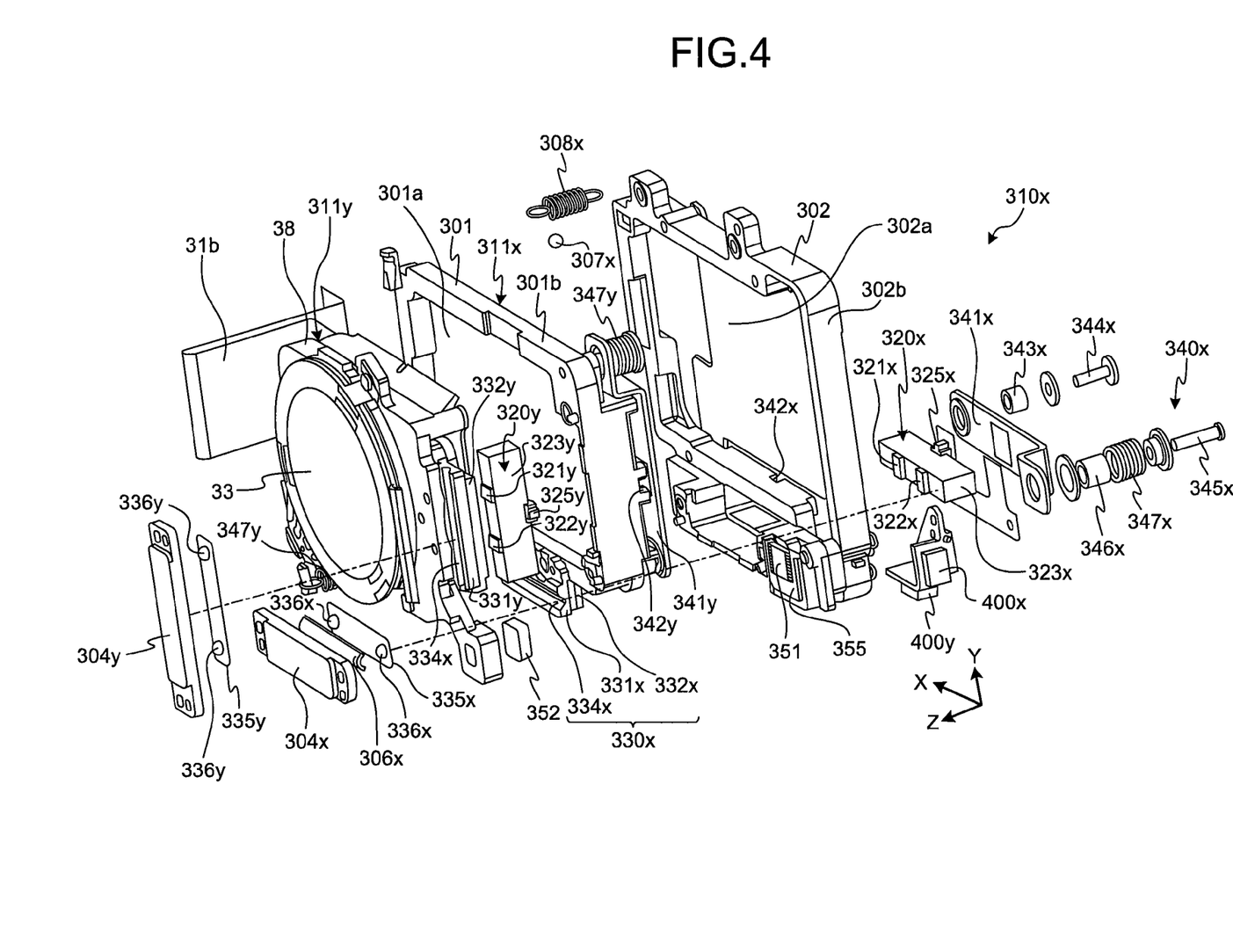
FIG. 4 is an exploded perspective view showing a structural example of a vibration-proof unit.
Figure 5:
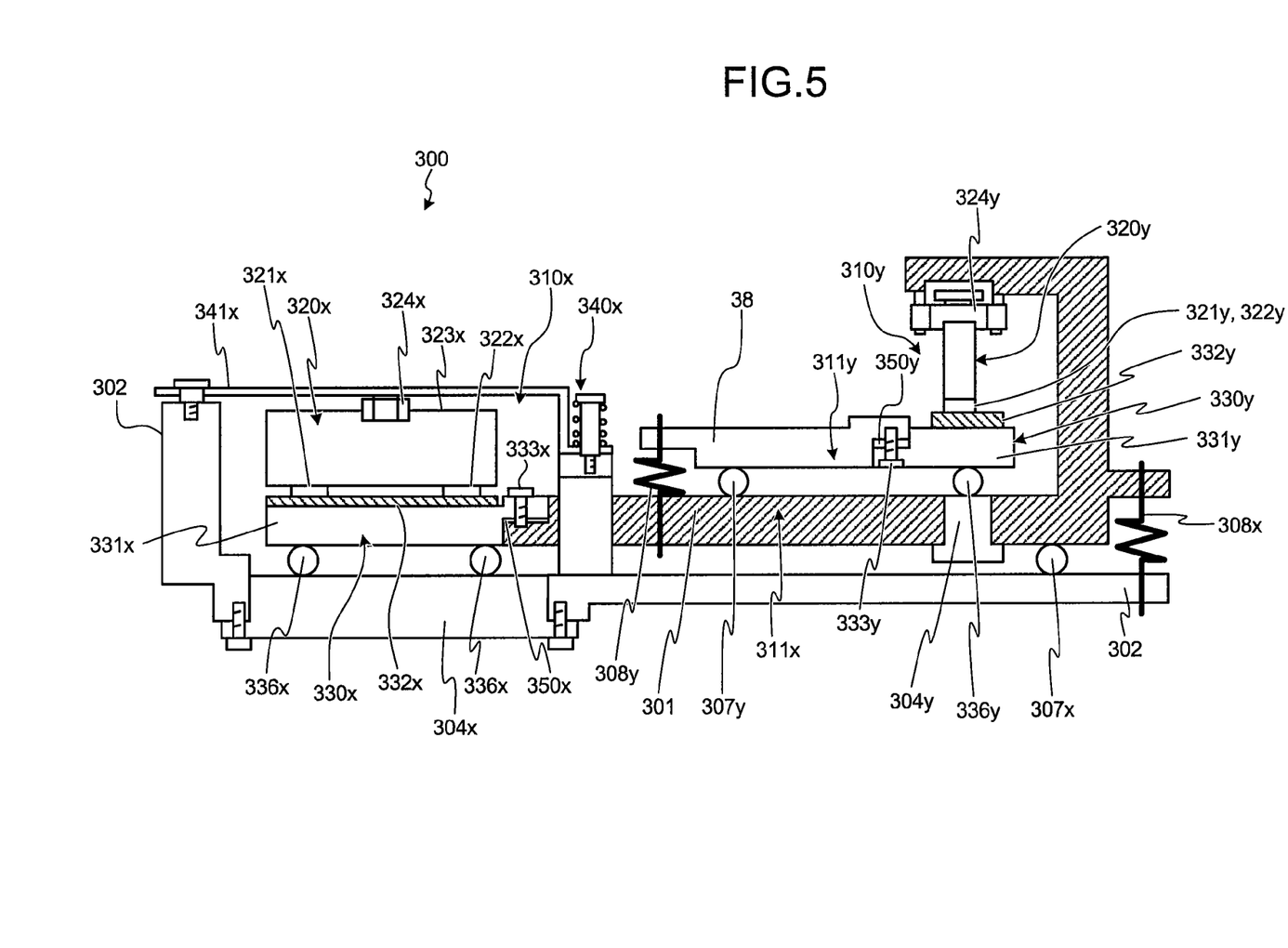
FIG. 5 is a schematic side view of the vibration-proof unit, showing a simplified shape of each part shown in FIG. 4.
Figure 6:
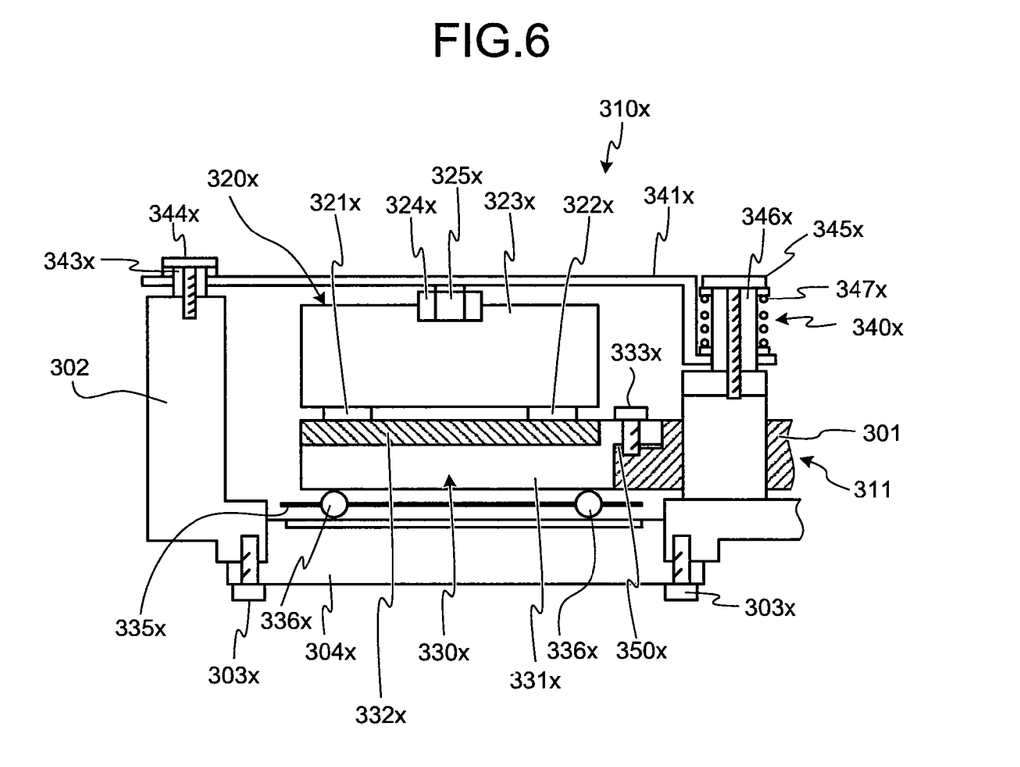
FIG. 6 is a schematic side view showing an extracted and magnified X-axis driving mechanism in FIG. 5.
Figure 7:
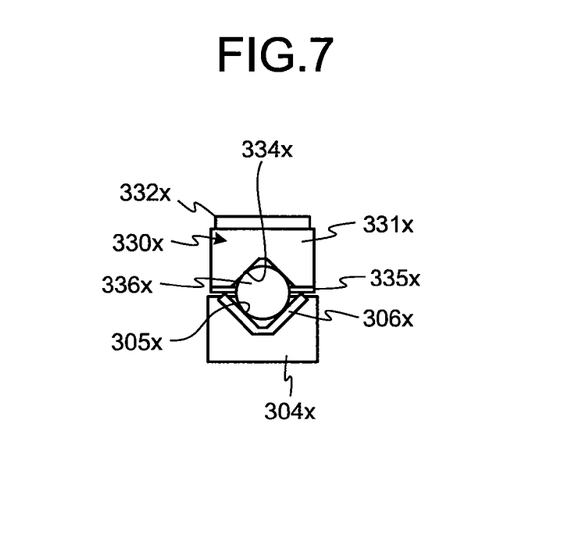
FIG. 7 is a cross sectional view showing a guide bearing structure.

Next, the vibration-proof unit using the vibrator as a driving source according to the embodiment will be explained with reference to FIGS. 4 to 7. FIG. 4 is an exploded perspective view showing a structural example of the vibration-proof unit according to the embodiment, FIG. 5 is a schematic side view of the vibration-proof unit, showing a simplified shape of each part shown in FIG. 4, FIG. 6 is a schematic side view showing an extracted and magnified X-axis driving mechanism in FIG. 5, and FIG. 7 is a cross sectional view showing a guide bearing structure thereof.

In a vibration-proof unit 300 according to the embodiment, the holder 38 mounting the CCD 31 together with the optical LPF 32, the dust-proof filter 33, and the like is configured as an ultimate moving target to be moved in the X-axis direction and the Y-axis direction. The vibration-proof unit 300 includes an X-frame (a first mobile body part) 301 which is provided as a second member and formed in a frame shape, and a frame (fixation member) 302 which is provided as a first member and formed in a frame shape. The X-frame 301 is formed in a frame shape having a frame part 301*b* surrounding an opening 301*a* around the imaging optical axis and in a desired size so that the holder 38 is mounted therein to be movable in the Y-axis direction. The frame 302 is formed in a frame shape having a frame part 302*b* surrounding an opening 302*a* around the imaging optical axis and in a desired size so that the X-frame 301 is mounted therein to be movable in the X-axis direction, and fixed to the camera main body not shown.

The vibration-proof unit 300 further includes an X-axis driving mechanism 310*x* which enables a relative displacement of the X-frame 301 in the X-axis direction with respect to the frame 302, and a Y-axis driving mechanism 310*y* which enables a relative displacement of the holder 38 in the Y-axis direction with respect to the X-frame 301. By enabling the relative displacement of the holder 38 together with the X-frame 301 in the X-axis direction with respect to the frame 302 as well as the relative displacement of the holder 38 in the Y-axis direction with respect to the X-frame 301, the position of the CCD 31 mounted to the holder 38 is changed and moved in the X-axis direction and the Y-axis direction within the XY plane so that the blurring motion is compensated.

Here, the structure of the X-axis driving mechanism 310x will be explained. The X-axis driving mechanism 310x includes an X-axis vibrator (a first vibrator) 320x, a sliding body (a second mobile body part) 330x which is integrally fixed to a mobile body (a first mobile body) 311x, and a pressing mechanism (a biasing unit) 340x which biases the X-axis vibrator 320x to the side of the sliding body 330x.

Based on the operation principle of the vibrator 200 explained with reference to FIG. 3, the X-axis vibrator 320x includes, on one surface of a piezoelectric body 323x of a rectangular shape, drivers (driving parts) 321x and 322x which generate the elliptical vibration when a voltage of a predetermined frequency for the resonance of the X-axis vibrator 320x is applied thereto. The X-axis vibrator 320x has a vibrator holder 324x at a center position on a side opposite the side where the drivers 321x and 322x are provided, of the piezoelectric body 323x. When a protrusion 325x formed at the vibrator holder 324x fits in a groove 342x (a retaining part) of the frame 302, the X-axis vibrator 320x is positioned and retained so that the movement of the X-axis vibrator 320x in the X-axis direction is regulated. With such a structure, a driving force of the elliptical vibration generated in the drivers 321x and 322x works in the X-axis direction.

The sliding body 330x is formed by fixing a sliding plate (sliding part) 332x as a first sliding member on a bearing (a guide-receiving part) 331x. The bearing 331x is integrally fixed, for example by using a screw 333x, to a part of the X-frame 301 at positions where the drivers 321x and 322x of the X-axis vibrator 320x are pressed to be in contact with the sliding plate 332x. The fixation of the sliding body 330x to the X-frame 301 is not limited to the screwing method, may be an adhesive bonding and the like, and any other fixation methods may be employed. Here, the sliding body 330x is formed in a size (a size corresponding to the X-axis vibrator 320x) smaller than the X-frame 301 formed in a desired size as apparently seen in FIG. 4. Besides, while the X-frame 301 is formed by using a resin material, aluminum, and the like having poor rigidity, the sliding plate 332x is formed by using ceramics and the like having an abrasion resistance and greater rigidity. In addition, the bearing 331x is formed to have high rigidity by hardening materials such as ferritic stainless-steel suitable for the hardening.

The frame 302 includes a bearing (a guiding part) 304x which is arranged at an attachment part having an opening shape formed in the frame 302, and fixed with a screw 303x in a manner of facing the bearing 331x of the sliding body 330x. A V-shaped groove plate 306x for wear prevention is fixed to the bearing 304x to form a V-shaped groove 305x along the X-axis direction as shown in FIG. 7. A V-shaped groove 334x is formed in the bearing 331x in a manner of facing the V-shaped groove 305x (V-shaped groove plate 306x) of the bearing 304x as shown in FIG. 7. Here, by putting two balls 336x (a rolling body) whose positioning is made by a retainer 335x between the V-shaped grooves 305x and 334x, the bearings 304x and 331x are configured to have two balls 336x arranged in line along the X-axis direction. The two balls 336x are positioned respectively in the vicinity of positions right under the drivers 321x and 322x as shown in FIG. 6 and the like, and the movement of the balls 336x in the X-axis direction is regulated by the retainer 335x. It should be noted that the rolling body is not limited to such balls and may be a roller.

The pressing mechanism 340x includes a pressing plate 341x and a pressing spring 347x. One end of the pressing plate 341x is fixed to the frame 302 as the first member via a screw 344x through a spacer 343x to retain the X-axis vibrator 320x. The pressing spring 347x is arranged through a spacer 346x around a screw 345x fixing the other end of the pressing plate 341x to the frame 302, and biases the pressing plate 341x so that the drivers 321x and 322x of the X-axis vibrator 320x are pressed to be in contact with the sliding plate 332x. The pressing force of the pressing mechanism 340x is set to be very large enough to be as much as 15N (newton).

Though the bearing 331x can rotate around the axis which penetrates the center of the balls 336x and is parallel to the V-shaped groove 334x, since the bearing 331x is integrated to the X-frame 301 and a ball 307x (a rotating body) is provided between the frame 302 and the X-frame 301 at a position away from the bearing 331x in a direction different from the X-axis direction (a position almost diagonal and farthermost from the bearing 331x on the frame part 302b), the rotation of the bearing 331x can be prevented. The ball 307x is retained in a state of being between the frame 302 and the X-frame 301 by a biasing force of a spring 308x which is latched therebetween in the vicinity of the ball 307x, and allows positioning the frame 302 and the X-frame 301 with a distance in the imaging optical axis (Z-axis) direction maintained therebetween. Here, it is only necessary to keep the ball 307x in between, and therefore the biasing force of the spring 308x is set to be much smaller than that of the pressing spring 347x. In this structure, the mobile body 311x constituted by the X-frame 301 and the sliding body 330x is configured to be movable with respect to the frame 302 based on the three-point supporting with the two balls 336x and the one ball 307x. Besides, the distance between the ball 307x and the balls 336x can be kept away by arranging the ball 307x at an opposite side across the imaging optical axis and the opening 301a from the balls 336x, and thereby a stable three-point supporting structure can be secured. According to the embodiment as described, the moving direction of the mobile body 311x can be guided and an inclination can also be regulated with the three balls (rotating bodies), and thereby a stable driving can be obtained.

Meanwhile, the basic structure of the Y-axis driving mechanism 310y is the same as that of the X-axis driving mechanism 310x. Therefore, a common part or a corresponding part is shown by being assigned with the same symbol having a suffix "y", and the explanation of such parts will not be repeated. In the Y-axis driving mechanism 310y, the X-frame 301 instead of the frame 302 is the fixation member, and the holder 38 instead of the X-frame 301 is the first mobile body part (or a third mobile body part) as the moving target. The Y-axis driving mechanism 310y includes a sliding body (the second mobile body part or a fourth mobile body part) 330y which is integrally fixed to the holder 38 and constitutes a mobile body (a second mobile body) 311y as the driving target together with the holder 38.

In the vibration-proof unit 300 according to the embodiment, the frame 302 is provided with an X-axis gyroscope 400x which detects a blurring motion about the X-axis (a blurring motion in the pitch direction) of the body unit 100 and a Y-axis gyroscope 400y which detects a blurring motion about the Y-axis (a blurring motion in the yaw direction) of the body unit 100. The vibration-proof unit 300 includes a position detection sensor 353 which is constituted by a Hall element 351 provided to the frame 302 and a magnet 352 which is provided at a part of the holder 38 to face the Hall element 351. The vibration-proof unit 300 further includes a vibration-proof control circuit 355 which controls a vibrator driving circuit 354 working for the X-axis vibrator 320x and a Y-axis vibrator 320y as a second vibrator based on signals from the X-axis gyroscope 400x, the Y-axis gyroscope 400y, and the position detection sensor 353. The vibration-proof control circuit 355 executes a controlling operation according to a command from the Bucom 50.

Next, an operation of the X-axis driving mechanism 310x will be explained. When a voltage of a predetermined frequency is applied to the X-axis vibrator 320x to generate the elliptical vibration in the drivers 321x and 322x, the sliding body 330x is driven to the rotating direction of the elliptical vibration generated by the drivers 321x and 322x since the drivers 321x and 322x of the X-axis vibrator 320x are pressed to be in contact with the sliding plate 332x due to the strong biasing force of the pressing mechanism 340x.

On this occasion, if the rigidity of the sliding plate 332x and the bearing 331x constituting the sliding body 330x is poor, the sliding plate 332x and the bearing 331x are flexed due to the imposed pressing force since the pressing force applied to the X-axis vibrator 320x is strong. As a result, the drivers 321x and 322x and the sliding plate 332x come to have a partial contact with each other, and an unstable operation or an operation failure occurs.

In this respect, since the sliding plate 332x and the bearing 331x constituting the sliding body 330x has high rigidity in the embodiment, the state where the drivers 321x and 322x and the sliding plate 332x are pressed to be in contact with each other is stable. As a result, the driving force generated by the elliptical vibration can be surely transmitted to the sliding plate 332x and the driving in the rotating direction of the elliptical vibration can be achieved with high efficiency. On this occasion, the sliding body 330x having the sliding plate 332x is not in surface contact with the frame 302, but in contact via the balls 336x at the bearing 331x and the bearing 304x in a rolling method. Therefore, the sliding body 330x can surely move under a condition of a little friction with the frame 302 even when the pressing force is strong. Since the bearings 331x and 304x form an in-line ball bearing structure along the X-axis direction, the sliding body 330x moves only in the X-axis direction when driven by the X-axis vibrator 320x. When the sliding body 330x moves in this manner, the X-frame 301 to which the sliding body 330x is fixed also moves in the X-axis direction integrally with the sliding body 330x. In other words, the moving direction of the X-frame 301 is also guided due to the engagement between the bearings 331x and 304x of the in-line ball bearing structure along the X-axis direction.

In such operations, the bearing 331x can rotate around the axis which penetrates the center of the balls 336x and is parallel to the V-shaped groove 334x. Here, the bearing 331x is integrated to the X-frame 301 and one ball 307x is provided between the frame 302 and the X-frame 301 at the position away from the bearing 331x in the direction different from the X-axis direction. Further, the mobile body 311x constituted by the X-frame 301 and the sliding body 330x is supported at three away positions with the two balls 336x and the one ball 307x with respect to the frame 302. As a result, the bearing 331x stably moves on the frame 302 in the X-axis direction without causing a swing due to the rotation around the axis parallel to the V-shaped groove 334x. Hence, a guide supporting mechanism as a part where a strong pressing force is given to the X-axis vibrator 320x can be realized by the in-line ball bearing structure formed by the bearings 331x and 304x along the X-axis direction, enabling a downsizing and a simplification in the structure.

The Y-axis driving mechanism 310y operates in the same manner as the X-axis driving mechanism 310x.

Next, a resonance involved by a transmission, to the X-frame 301 and the holder 38, of the vibration caused by the driving of the X-axis vibrator 320x and the Y-axis vibrator 320y will be considered. For example, since the X-axis vibrator 320x is directly pressed to be in contact with the sliding body 330x and the sliding body 330x is driven by a frictional force due to the vibration generated between the X-axis vibrator 320x and the sliding body 330x as the X-axis vibrator 320x is driven, the vibration of the X-axis vibrator 320x is directly transmitted to the sliding body 330x and the X-frame 301 to which the sliding body 330x is fixed. As a result, there is a possibility of causing a resonance in the X-frame 301 and a difficulty in obtaining a desired driving performance. In other words, when a relationship between a driving frequency f input to the X-axis vibrator 320x and a driving velocity V is monitored, there is a possibility that the driving velocity V deteriorates due to the resonance in the X-frame 301 as shown as "BAD" performance in FIG. 8. Or more specifically, as shown as "BAD" performance in FIG. 9A, there is a possibility of showing a rough transition of the driving velocity V with respect to the driving frequency f, and causing an inflection point (a peak and a trough) where the velocity decreases once. If such an inflection point is present in the vicinity of a frequency range to be actually used, the driving of the X-axis vibrator 320x cannot be controlled properly. The same applies to the side of the Y-axis vibrator 320y.

To prevent such problems, it is necessary not to allow the resonance in the X-frame 301 and the holder 38 caused by the vibration of the X-axis vibrator 320x and the Y-axis vibrator 320y as described above. However, when the mobile bodies 311x and 311y are frictionally driven by using the vibrators 320x and 320y, the mobile bodies 311x and 311y are not linearly displaced and a degree of difficulty in a vibration analysis grows as the shapes of the X-frame 301 and the holder 38 become complicated. Thus, even though the vibration analysis is simulated, it is difficult to secure a desired driving performance since there arises a gap between an actual driving situation and the simulation of the vibration analysis. This is why the simulation does not seem realistic.

In response, it is considered in the embodiment that the inflection point as described above is caused by a resonance in parts constituting the actuator because a natural frequency of the X-frame 301 and the holder 38 coincides with a driving frequency of the vibrators 320x and 320y depending on a way of fixing driving transmitting parts of the vibrators 320x and 320y respectively to the X-frame 301 and the holder 38. To prevent such a resonance in the embodiment, a vibration transmission changing member is further provided so that the natural frequency of the X-frame 301 and the holder 38 is configured to be out of the driving frequency of the vibrators 320x and 320y (to be a frequency substantially away from the driving frequency of the vibrators 320x and 320y); a vibration of the same frequency as the driving frequency of the vibrators 320x and 320y is not allowed to be transmitted to the X-frame 301 and the holder 38; or the vibration from the vibrators 320x and 320y is absorbed and attenuated to change a manner of transmitting the vibration from the vibrators 320x and 320y to the X-frame 301 and the holder 38.

Figure 10:
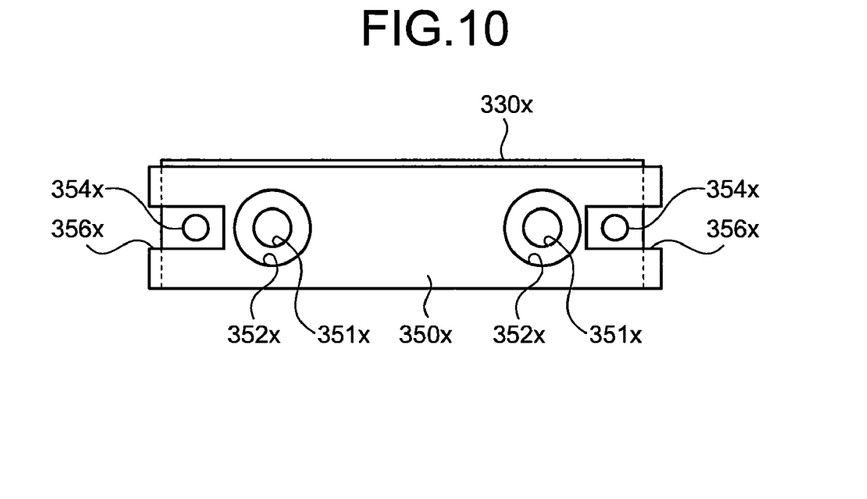
FIG. 10 is a front view showing an attachment example of an intervening member.
Figure 11:
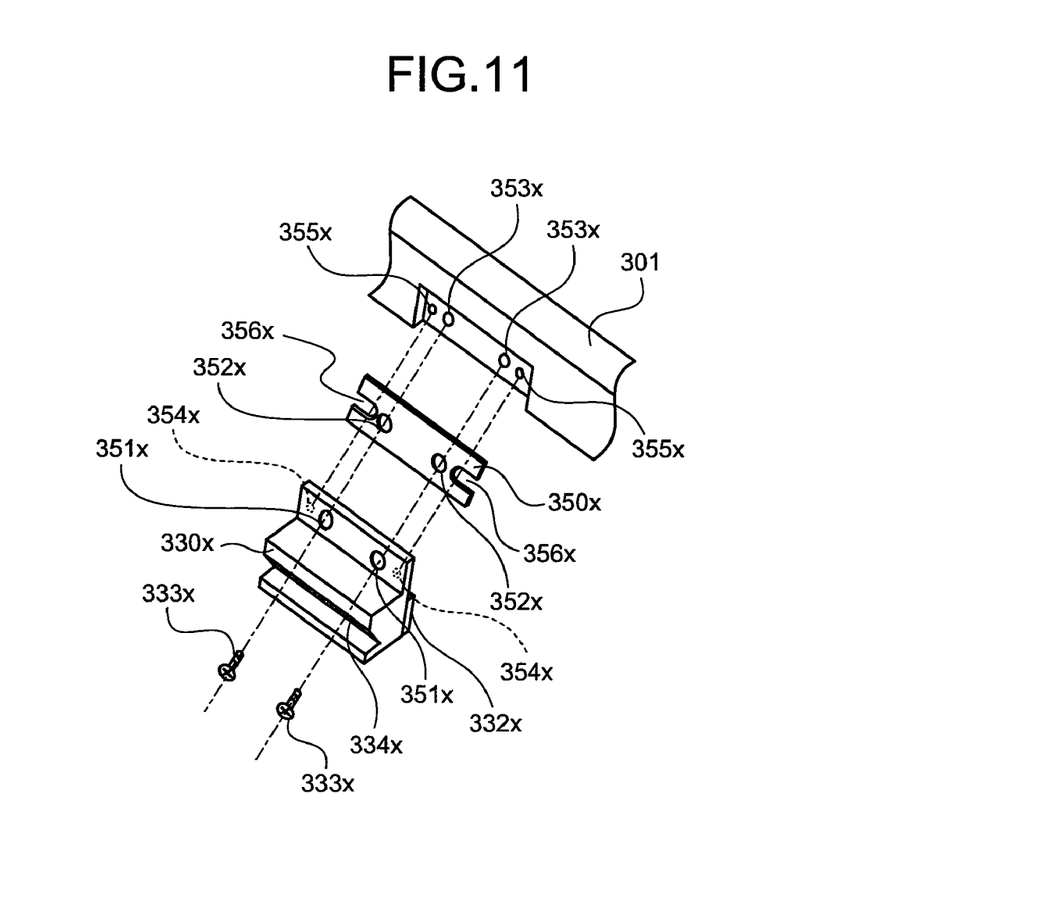
FIG. 11 is an exploded perspective view showing an attachment example of the intervening member.

FIGS. 10 and 11 show one example of the vibration transmission changing member, and an intervening member 350x which serves as a first resonance preventive member intervening at a joint part between the X-frame 301 as the first mobile body part and the sliding body 330x as the second mobile body part is provided as the vibration transmission changing member. Here, the intervening member 350x is formed, in a rectangular reed-like shape, of a rubber material such as silicon and fixed to the sliding body 330x and the X-frame 301 with screws 333x in a state of intervening between the sliding body 330x and the X-fame 301. The sliding body 330x and the intervening member 350x have screw holes 351x and screw relief holes 352x respectively for the screws 333x, and the X-frame 301 has screw holes 353x for the screws 333x. The sliding body 330x has positioning pins 354x and is positioned by fitting the positioning pins 354x into positioning holes 355x formed in the X-frame 301.

The intervening member 350x has clearances 356x which have a semicircular shape and keep away from the positioning pins 354x at both ends. This means that the intervening member 350x is placed between the X-frame 301 and the sliding plate 332x.

Similarly, an intervening member 350y which serves as a second resonance preventive member is provided, as the vibration transmission changing member, in a manner of intervening between the holder 38 as the third mobile body part and the sliding body 330y as the fourth mobile body part (see FIG. 5). The vibrator 320y is provided with drivers 321y and 322y, and a sliding plate 332y as a second sliding member is fixed to the sliding body 330y and placed between the sliding body 330y and the drivers 321y and 322y. In addition, the sliding body 330y is fixed to the holder 38 via the intervening member 350y. This means that the intervening member 350y is provided between the holder 38 and the sliding plate 332y.

In the embodiment as described above, the sliding body 330x and the X-frame 301 are fixed with the screws 333x in the state of placing the intervening member 350x formed of a silicon rubber and the like therebetween, and a vibration having the same frequency as the driving frequency of the X-frame vibrator 320x is attenuated by the intervening member 350x, thereby allowing to change the way of transmitting the vibration. With this structure, it is possible to eliminate the resonance in the X-frame 301 or to make the natural frequency of the X-frame 301 out of the driving frequency of the X-frame vibrator 320x. The same applies to the side of the intervening member 350y.

Figure 8:
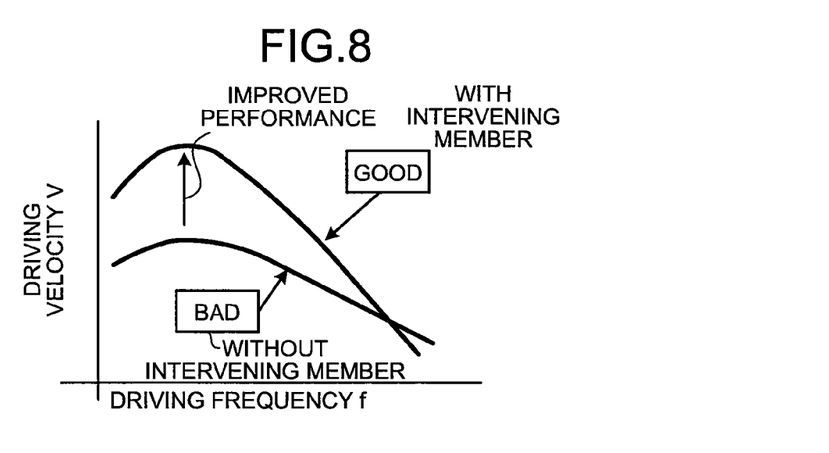
FIG. 8 is a curve diagram showing a relationship between a driving frequency input to the vibrator and a driving velocity in both a method of the embodiment and a method of the conventional technique in comparison with each other.
Figure 9A:
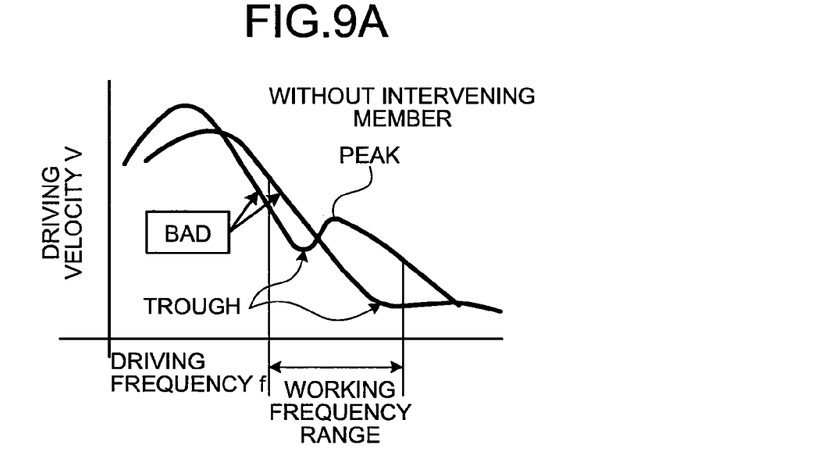
FIGS. 9A and 9B are curve diagrams each showing a relationship between a driving frequency input to the vibrator and a driving velocity separately, 9A especially showing the relationship in the method of the conventional technique and 9B showing the relationship in the method of the embodiment.
Figure 9B:
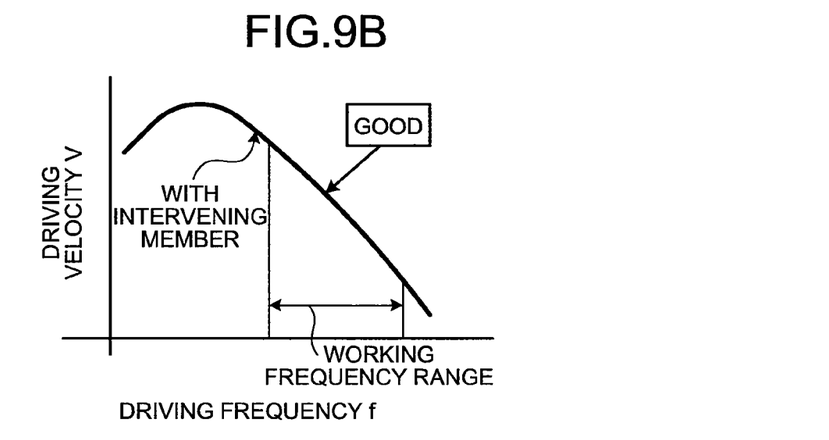

With the intervention of the intervening member 350x, it is possible to prevent the deterioration of the driving velocity V with respect to the driving frequency f input to the X-axis vibrator 320x and to improve the performance as shown as "GOOD" performance in FIG. 8, compared with a case without the intervening member 350x. Or more specifically, as shown as "GOOD" performance in FIG. 9B, it is possible to eliminate the occurrence of the inflection point and make the velocity transition smooth. Thus, by putting the intervening member 350x in between, the driving of the X-axis vibrator 320x can be controlled properly within the working frequency range. The same applies to the side of the intervening member 350y.

The material of the intervening members 350x and 350y is not limited to an elastic material made of a rubber material, and may be formed by using an elastic material made of a resin material and the like. Besides, the material of the intervening members 350x and 350y is not limited to the elastic material, and may be formed by using a metal material such as a brass plate. When an intervening member formed of a metal material intervenes in between, it is possible to change the way of transmitting the vibration so that the natural frequency of the X-frame 301 and the holder 38 changes. By putting the intervening member formed of the metal material in between to make the natural frequency shift out of the driving frequency of the vibrators 320x and 320y, it is possible to eliminate the occurrence of the resonance with the driving frequency in the X-frame 301 and the holder 38, that is, to prevent the resonance. According to experiments performed by the inventor, a good effect of preventing the resonance was obtained by a combination of the intervening member 350x which is formed of a rubber such as the silicon rubber with respect to the X-frame 301, and the intervening member 350y which is formed of a metal such as the brass plate with respect to the holder 38.

The intervening members are resonance preventive members which prevent the resonance in the X-frame 301 and the holder 38, and serve to attenuate the vibration transmitted from the vibrators to the X-frame 301 and the holder 38 via a conversion to a thermal energy and the like or to shift the resonance point by changing an inertia amount of the vibration system. Consequently, both are formed of an impact absorbing material such as a rubber and an elastomer, and a metal material, a synthetic resin, and the like may be arbitrarily selected according to the circumstances.

Figure 12:
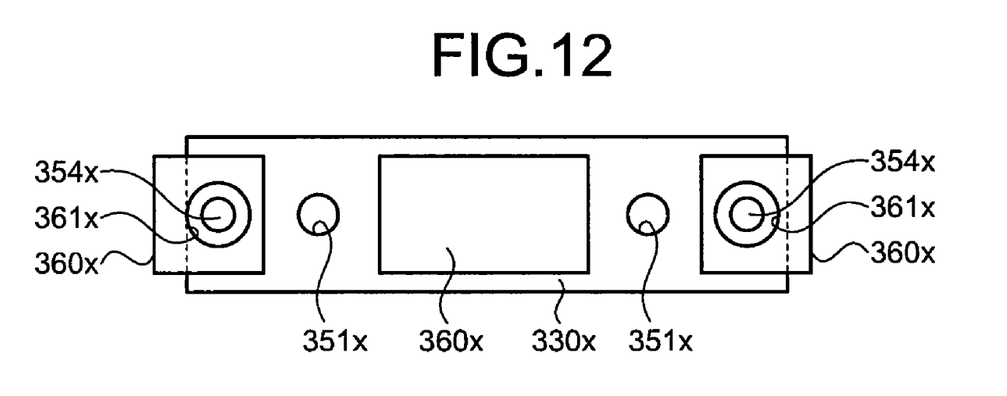
FIG. 12 is a front view showing an attachment example of an intervening member according to a modification.

The intervening member 350x according to the embodiment has an enough size to cover all over the joint part between the sliding body 330x and the X-frame 301. However, a plurality of intervening members 360x which are dispersed and arranged at a center part and both end parts in the joint part may be employed alternatively as shown in FIG. 12. A numeral 361x denotes a relief hole for the positioning pin 354x.

Figure 13:
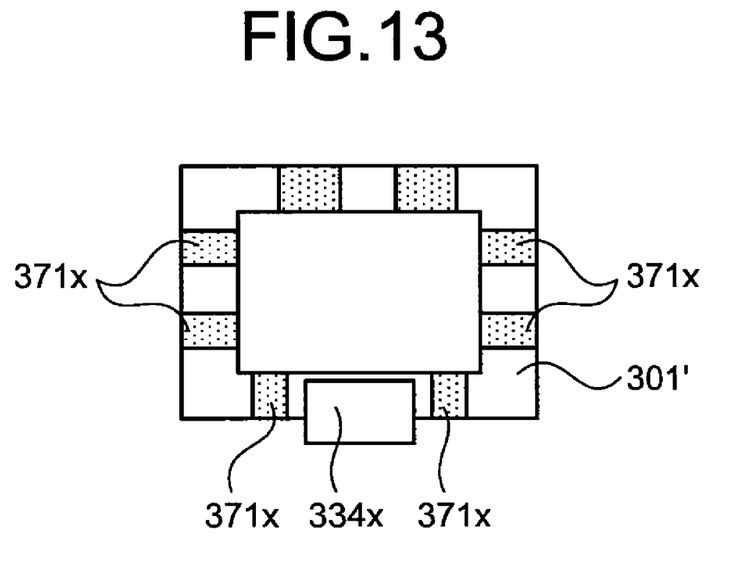
FIG. 13 is a front view showing an X-frame according to another embodiment.
Figure 14:
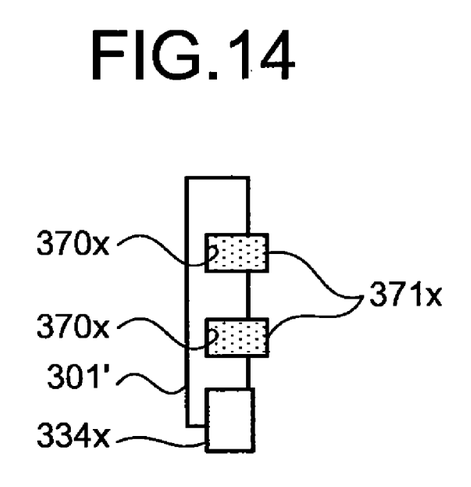
FIG. 14 is a side view of the X-frame shown in FIG. 13.
Figure 15:
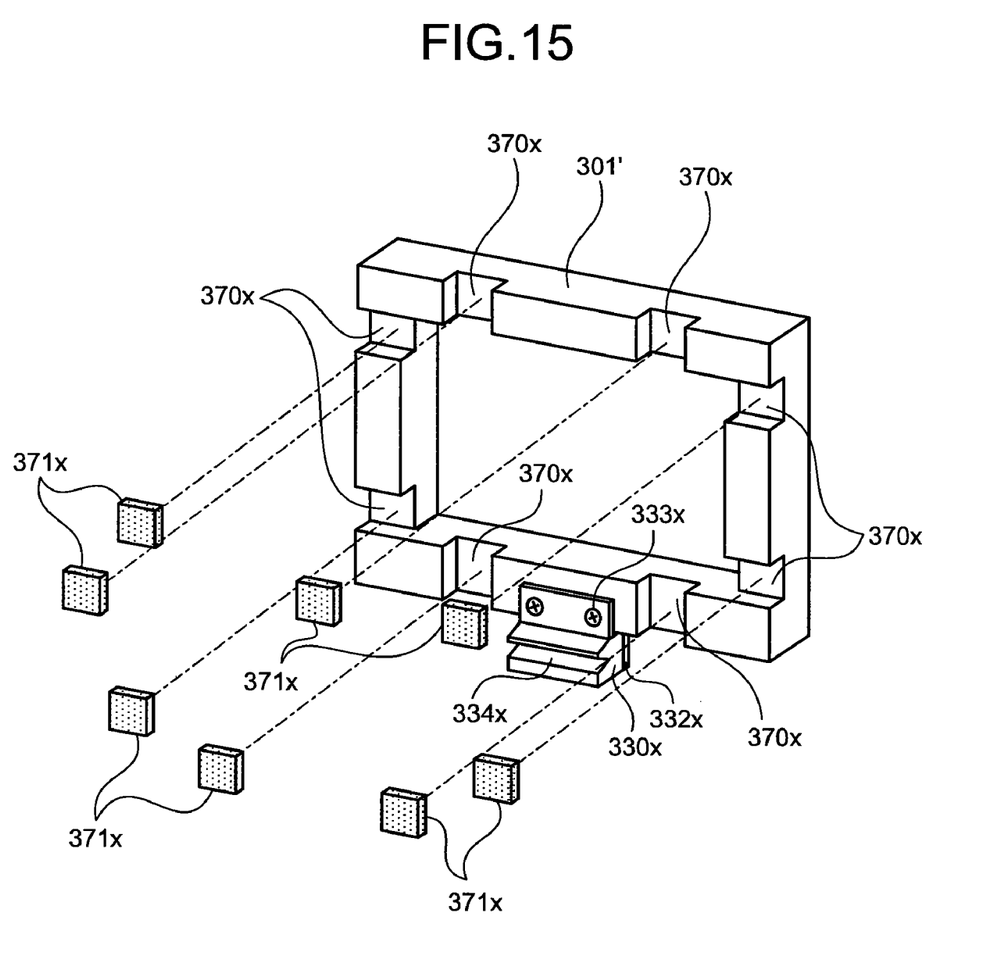
FIG. 15 is an exploded perspective view of a periphery of the X-frame shown in FIG. 13.

FIGS. 13 to 15 show another embodiment of the vibration transmission changing member, FIG. 13 is a front view of an X-frame 301', FIG. 14 is a side view of the X-frame 301', and FIG. 15 is an exploded perspective view of the periphery of the X-frame 301'. In this embodiment, a plurality of grooves 370x are formed and dispersed on the vibration route along the frame shape of the X-frame 301' having a large volume, and filling members 371x which fills the plurality of grooves 370x and is adhesively fixed thereto are used as the vibration transmission changing member. Though the filling member 371x is, for example, formed of a resin material or a metal material, the material, the size, and the number may be changed as the need arises. A fixation method is not limited to the adhesive bonding, and any other methods including a screw fixation may be employed when needed.

By providing the plurality of filling members 371x on the vibration route of the X-frame 301', the natural frequency of the X-frame 301' can be set not to be close to the driving frequency of the X-axis vibrator 320x since the natural frequency of the X-frame 301' as a mobile body having a large volume is adjusted so that the way of transmitting the vibration from the X-axis vibrator 320x is different from the case of being constituted by the X-frame 301 exclusive of the filling members 371x. Thus, it is possible to suppress the deterioration of the performance and the occurrence of the inflection point in the driving velocity within the working frequency range of the X-axis vibrator 320x.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A driving apparatus having a piezoelectric element as a driver, comprising:
   a first vibrator which generates an elliptical vibration when a voltage of a predetermined frequency is applied;
   a first member which holds the first vibrator;
   a frame member which includes a first sliding member to which the first vibrator is pressed and makes a relative displacement with respect to the first member by being driven by the elliptical vibration of the first vibrator; and
   a first resonance preventive member which is provided to the frame member and prevents a resonance in the frame member from being generated by the elliptical vibration of the first vibrator.

2. The driving apparatus according to claim 1, wherein the first resonance preventive member is an intervening member provided between the frame member and the first sliding member.

3. The driving apparatus according to claim 1, wherein the first resonance preventive member is fixed to the frame member.

4. The driving apparatus according to claim 1, wherein the first resonance preventive member is a filling member formed by being dispersed on a vibration route in the frame member.

5. The driving apparatus according to claim 1, wherein the first member is a fixed fixation member.

6. The driving apparatus according to claim 1, wherein the first member is formed as a frame member.

7. The driving apparatus according to claim 1, wherein the first resonance preventive member is formed of an elastic material.

8. The driving apparatus according to claim 1, wherein the first resonance preventive member is formed of a metal material.

9. The driving apparatus according to claim 2, wherein the intervening member is formed of an elastic material.

10. The driving apparatus according to claim 2, wherein the intervening member is formed of a metal material.

11. A driving apparatus having a first vibrator which generates an elliptical vibration when a voltage of a predetermined frequency is applied;
   a first member which holds the first vibrator;
   a second member which includes a first sliding member to which the first vibrator is pressed and makes a relative displacement with respect to the first member by being driven by the elliptical vibration of the first vibrator; and
   a first resonance preventive member which is provided to the second member and prevents a resonance in the second member from being generated by the elliptical vibration of the first vibrator,
   wherein the second member is a frame member;
   a second vibrator which is provided to the second member and generates an elliptical vibration when a voltage of a predetermined frequency is applied;
   a third member which is provided so as to be movable in a direction perpendicular to a moving direction of the second member, includes a second sliding member to which the second vibrator is pressed, and makes a relative displacement with respect to the second member by being driven by the elliptical vibration of the second vibrator; and
   a second resonance preventive member which is provided to the third member and prevents a resonance in the third member from being generated by the elliptical vibration of the second vibrator.

12. The driving apparatus according to claim 11, wherein the second resonance preventive member is an intervening member provided between the third member and the second sliding member.

13. The driving apparatus according to claim 11, wherein the second resonance preventive member is a filling member which is formed by being dispersed on a vibration route of the third member.

14. The driving apparatus according to claim 11, wherein the second resonance preventive member is fixed to the third member.

15. The driving apparatus according to claim 12, wherein the intervening member is formed of an elastic material.

16. The driving apparatus according to claim 12, wherein the intervening member is formed of a metal material.

17. The driving apparatus according to claim 11, serving as a blurring motion correcting mechanism used for a camera constituted by the third member mounting thereon an image pickup element.

* * * * *